United States Patent
Liou

(10) Patent No.: US 9,225,290 B2
(45) Date of Patent: Dec. 29, 2015

(54) RADIO FREQUENCY SIGNAL AMPLIFYING SYSTEM

(71) Applicant: MICROELECTRONICS TECHNOLOGY, INC., Hsinchu (TW)

(72) Inventor: Ming Che Liou, Hsinchu (TW)

(73) Assignee: MICROELECTRONICS TECHNOLOGY, INC., Hsinchu (TW)

( * ) Notice: Subject to any disclaimer, the term of this patent is extended or adjusted under 35 U.S.C. 154(b) by 108 days.

(21) Appl. No.: 14/090,629

(22) Filed: Nov. 26, 2013

(65) Prior Publication Data

US 2015/0145599 A1    May 28, 2015

(51) Int. Cl.
| | |
|---|---|
| H03F 1/02 | (2006.01) |
| H03F 1/56 | (2006.01) |
| H03F 3/193 | (2006.01) |
| H03F 3/24 | (2006.01) |
| H03F 3/26 | (2006.01) |

(52) U.S. Cl.
CPC ............ *H03F 1/0222* (2013.01); *H03F 1/0233* (2013.01); *H03F 1/0266* (2013.01); *H03F 1/0272* (2013.01); *H03F 1/56* (2013.01); *H03F 3/193* (2013.01); *H03F 3/245* (2013.01); *H03F 3/265* (2013.01); *H03F 2200/207* (2013.01); *H03F 2200/435* (2013.01); *H03F 2200/451* (2013.01); *H03F 2200/534* (2013.01); *H03F 2200/541* (2013.01)

(58) Field of Classification Search
CPC ............................ H03G 3/20; H03F 2200/435
USPC ......................... 330/136, 144, 145, 280, 284
See application file for complete search history.

(56) References Cited

U.S. PATENT DOCUMENTS

| | | | | |
|---|---|---|---|---|
| 5,138,277 | A | * | 8/1992 | Robinson et al. ............. 330/281 |
| 5,477,200 | A | * | 12/1995 | Ono ............................ 333/81 R |
| 8,344,799 | B2 | * | 1/2013 | Hayakawa ................ 330/124 R |
| 2008/0048775 | A1 | * | 2/2008 | Wang ............................ 330/136 |

OTHER PUBLICATIONS

Soshin Electric Co., Ltd., A product information of 1.96GHz Band Voltage Variable Attenuator, Dec. 1, 2004 (5 pages).
Linear Technology Corporation, "UltraFast 7ns Response Time 15GHz RF Power Detector with Comparator," 2010 (14 pages).
Analog Devices, "50 Hz to 3.8 GHz 65dB TruPwr Detector," 2012 (32 pages).
Avago Technologies, "HSMP-381x, 481x Surface Mount RF PIN Low Distortion Attenuator Diodes," Dec. 22, 2009 (9 pages).

(Continued)

*Primary Examiner* — Steven J Mottola
(74) *Attorney, Agent, or Firm* — Hamre, Schumann, Mueller & Larson, P.C.

(57) ABSTRACT

A radio frequency signal amplifying system includes an amplifier having an input terminal and an output terminal, an attenuator electrically connected to the input terminal of the amplifier, a peak power detecting module configured to apply a peak power attenuation signal to the attenuator by taking a peak power level of an input signal into consideration, and an average power detecting module configured to apply an average power attenuation signal to the attenuator by taking an average power level of an output signal from the output terminal into consideration. The attenuator is configured to generate the attenuated signal to the input terminal of the amplifier by taking the peak power attenuation signal, the average power attenuation signal, or the combination thereof into consideration.

20 Claims, 12 Drawing Sheets

(56) References Cited

OTHER PUBLICATIONS

Texas Instruments, "LM124, LM124A, LM224, LM224A, LM324, LM324A, LM2902, LM2902V,LM224K, LM224KA, LM324K, LM324KA, LM2902K, LM2902KV, LM2902KAV Quadruple Operational Amplifiers," Mar. 2010 (35 pages).

Murata Manufacturing Co., Ltd., "Available Product List for RoHS Restriction," Dec. 14, 2005 (12 pages).

* cited by examiner

RADIO FREQUENCY SIGNAL AMPLIFYING SYSTEM

TECHNICAL FIELD

The present disclosure relates to a radio frequency (RF) signal amplifying system, and more particularly, to a radio frequency signal amplifying system having a power attenuator for preventing the amplifiers from being damaged by over-driving.

DISCUSSION OF THE BACKGROUND

Complex modulation techniques such as Amplitude Modulation (AM) and Phase Modulation (PM) with spread spectrums in a code domain multiplex are widely used in new wireless communication systems. For example, Code Division Multiple Access (CDMA) and Wideband Code Division Multiple Access (WCDMA) are used in 3G wireless communication systems, and Orthogonal frequency-division multiplexing (OFDM) is used in Long Term Evaluation (LTE) wireless communication systems. These wide band modulated waveforms introduce a design challenge on controlling the Radio Frequency (RF) power of the amplifier. In particular, the high peak to average ratio (PAR) signals drive the amplifier to a non-linear region, and such high PAR signals reach the input power limit of the transistor in the amplifier, which increases the risk to cause the amplifier to burn-out during the operation.

Many Digital Pre-Distortion (DPD) amplifying systems use the crest factor reduction (CFR) technique to reduce the signal's PAR so as to improve the amplifier's non-linearity and increase the amplifier's power efficiency. However, on correcting a DPD loop's linearity for the amplifier's AM/PM distortion, the DPD loop needs to expand RF signal's gain/power to compensate the AM distortion on the amplifier's head room characteristics, and such RF signal's gain/power expanding will drive the peak power of the signal to be close to or even over the amplifier's saturated region.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY

One aspect of the present disclosure provides a radio frequency signal amplifying system having a peak power detector and an average power detector for preventing the amplifiers from over-driving and being damaged.

A radio frequency signal amplifying system according to this aspect of the present disclosure comprises an amplifier having an input terminal and an output terminal; an input coupler configured to divide an input signal into a first signal and a second signal; an attenuator electrically connected to the input terminal of the amplifier; a delay line connected between the input coupler and the attenuator; and a peak power detecting module configured to apply a peak power attenuation signal to the attenuator by taking a peak power level of the second signal into consideration, wherein the attenuator is configured to generate an attenuated signal to the input terminal of the amplifier by taking the peak power attenuation signal into consideration.

A radio frequency signal amplifying system according to another aspect of the present disclosure comprises an amplifier having an input terminal and an output terminal; an attenuator electrically connected to the input terminal of the amplifier; a peak power detecting module configured to apply a peak power attenuation signal to the attenuator by taking a peak power level of an input signal into consideration; and an average power detecting module configured to apply an average power attenuation signal to the attenuator by taking an average power level of an output signal from the output terminal into consideration, wherein the attenuator is configured to generate the attenuated signal to the input terminal of the amplifier by taking the peak power attenuation signal, the average power attenuation signal, or the combination thereof into consideration.

A radio frequency signal amplifying system according to another aspect of the present disclosure comprises an amplifier having an input terminal and an output terminal; an attenuator electrically connected to the input terminal of the amplifier; a peak power detecting module configured to apply a peak power attenuation signal to the attenuator by taking a peak power level of an input signal into consideration; and an average power detecting module configured to apply an average power attenuation signal to the attenuator by taking an average power level of an output signal from the output terminal into consideration, wherein the attenuator is configured to generate the attenuated signal to the input terminal of the amplifier by taking the peak power attenuation signal and the average power attenuation signal into consideration.

As the peak power level of the input signal increases over a pre-set peak power threshold (Povpeak), the peak power detecting module is enabled to apply the peak power attenuation signal (Vpeak-attn) to the attenuator, which correspondingly decreases the power level of the output attenuated signal (RFattn) when converting the first signal into the attenuated signal (RFattn) and to the input terminal of the amplifier. Similarly, as the average power level of the output signal increases over a pre-set average power threshold (Povavg), the average power detecting module is enabled to generate the average power attenuation signal (Vavg-attn) to the attenuator, which correspondingly decreases the power level of the attenuated signal (RFattn) when converting the first signal into the attenuated signal (RFattn) and to the input terminal of the amplifier.

The foregoing has outlined rather broadly the features and technical advantages of the present disclosure in order that the detailed description of the disclosure that follows may be better understood. Additional features and advantages of the disclosure will be described hereinafter, which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a radio frequency signal amplifying system having a power attenuator for preventing the amplifiers from being damaged by over-driving. In order to make the present disclosure completely comprehensible, detailed steps and structures are provided in the following description. Obviously, the implementation of the present disclosure does not limit special details known by persons skilled in the art. In addition, known structures and steps are not described in detail, so as not to limit the present disclosure unnecessarily. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
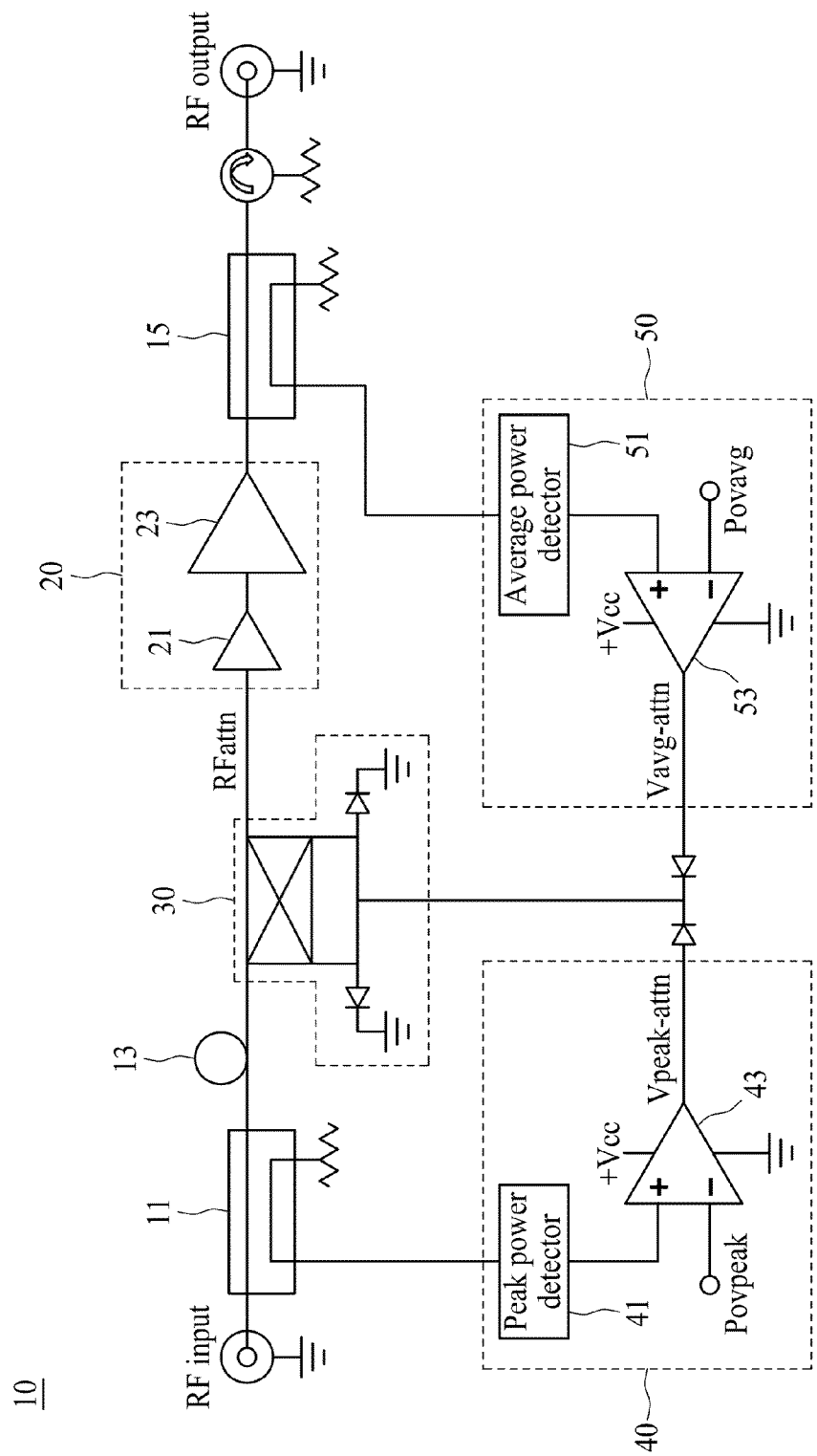
FIG. 1 is a schematic diagram showing a radio frequency signal amplifying system in accordance with embodiments of the inventive arrangements disclosed herein.

FIG. 1 is a schematic diagram showing a radio frequency signal amplifying system 10 in accordance with embodiments of the inventive arrangements disclosed herein. In some embodiments of the present disclosure, the signal amplifying system 10 comprises an amplifier module 20 having an input terminal and an output terminal, an attenuator 30 electrically connected to the input terminal of the amplifier module 20, a peak power detecting module 40 configured to apply a peak power attenuation signal (Vpeak-attn) to the attenuator 30 by taking a peak power level of a radio frequency input signal into consideration, and an average power detecting module 50 configured to apply an average power attenuation signal (Vavg-attn) to the attenuator 30 by taking an average power level of an output signal from the output terminal of the amplifier module 20 into consideration. In some embodiments of the present disclosure, the amplifier module 20 includes a gain block amplifier (driver amplifier) 21 and a high power amplifier (final stage amplifier) 23, and the attenuator 30 is configured to generate an attenuated signal (RFattn) to the input terminal of the amplifier module 20 by taking the peak power attenuation signal, the average power attenuation signal, or the combination thereof into consideration.

In some embodiments of the present disclosure, the signal amplifying system 10 further comprises an input coupler 11 configured to divide the input signal into a first signal and a second signal, and the peak power detecting module 40 is configured to apply the peak power attenuation signal (Vpeak-attn) to the attenuator 30 by taking the peak power level of the second signal into consideration. In some embodiments of the present disclosure, the signal amplifying system 10 further comprises an output coupler 15 configured to divide the output signal of the amplifier 23 into a third signal and a fourth signal, and the average power detecting module 50 is configured to apply the average power attenuation signal (Vavg-attn) to the attenuator 30 by taking the average power level of the fourth signal into consideration. In some embodiments of the present disclosure, the input coupler 11 and the output coupler 15 are directional couplers. In some embodiments, the coupler 11 can be implemented by a chip LDC311G9603 supplied by Murata Manufacturing co., ltd; and, the coupler 15 is a directional strip line coupler by RO4350 laminate PCB, supplied by Rogers corporation.

In some embodiments of the present disclosure, the peak power detecting module 40 comprises a peak power detector 41 connected to the input coupler 11, and a comparator 43 with an input node connected to the peak power detector 41 and an output node connected to the attenuator 30. In some embodiments of the present disclosure, the second signal from the RF input signal is fed to the matched RF peak power detector 41, which is configured to detect the power level of the second signal within nano-second periods and converts the power level into a detected peak power signal (Vop) for the subsequent comparator 43. The comparator 43 compares a pre-set peak power threshold (Povpeak) and the detected peak power signal (Vop) from the detector 41, and outputs the peak power attenuation signal (Vpeak-attn) to the attenuator 30 to decrease an amplitude of the attenuated signal to the drive amplifier 21 as the peak power level of the peak power attenuation signal (Vpeak-attn) increases. In some embodiments of the present disclosure, the peak power detector 41 includes a Schottky-Barrier diode, wherein the comparator 43 is a fast operational (OP) comparator, and the peak power detecting module 40 as a whole can be implemented by a chip LTC5564 supplied by Linear Technology Corporation.

In some embodiment of the present disclosure, the average power detecting module 50 comprises an average power detector 51 configured to detect an average (RMS) power of the fourth signal from the output signal of the amplifier 23, and a comparator 53 having an input node connected to the average power detector 51 and an output node connected to the attenuator 30. The comparator 53 compares a pre-set average power threshold (Povavg) and the detected average power signal (Voa) from the detector 51 and outputs the average power attenuation signal (Vavg-attn) to the attenuator 30. In some embodiments of the present disclosure, the average power detector 51 can be implemented by a chip AD8362 supplied by Analog Devices, Inc, and the comparator 53 can be implemented by a chip LM2902 supplied by Texas Instruments Incorporated.

In some embodiments of the present disclosure, the signal amplifying system 10 further comprises a delay line 13 connected between the input coupler 11 and the attenuator 30, and the delay line 13 has a length calculated by taking a response time of the attenuator 30 and a response time of the peak power detecting module 40 into consideration. Generally, a short delay line requires short response times of the attenuator 30 and the peak power detecting module 40. For example, the peak power detector 41 takes 3.0 ns for converting the RF power level of the second signal into the detected peak power signal (Vop), the comparator 43 takes 2.0 ns for generating the peak power attenuation signal (Vpeak-attn), and the attenuator 30 takes a minimum of 12.0 ns to generate the attenuated signal (RFattn). In total, it takes 17.0 ns to synchronize the first signal directly from the input coupler 11, and the attenuated signal (RFattn) from the peak power detecting module 40 through the attenuator 30. The 17.0 ns corresponds approximately to a 3.3 m miniature coaxial cable. In some embodiments of the present disclosure, the delay of the first signal directly from the input coupler 11 may be optionally implemented by using a wide band delay filter.

Figure 2:
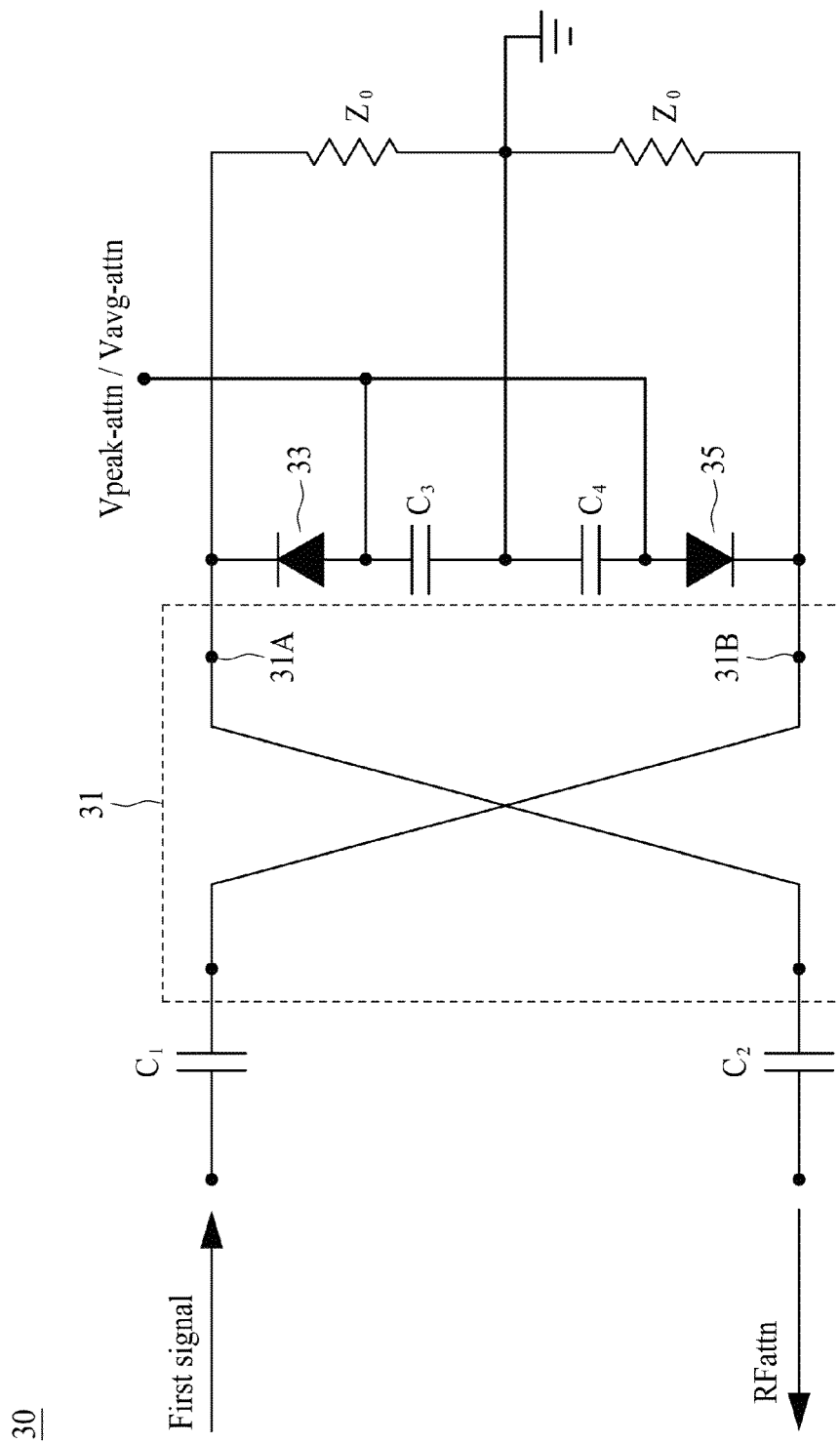
FIG. 2 is a schematic diagram showing the attenuator in accordance with embodiments of the inventive arrangements disclosed herein.

FIG. 2 is a schematic diagram showing the attenuator 30 in accordance with embodiments of the inventive arrangements disclosed herein. In some embodiments of the present disclosure, the attenuator 30 comprises a hybrid coupler 31 having a first port 31A and a second port 31B, a first diode 33 having a first positive node connected to the peak power detecting module 40 and a first negative node connected to a first port 31A of the hybrid coupler 31, and a second diode 35 having a second positive node connected to the peak power detecting module 40 and a second negative node connected to a second port 31B of the hybrid coupler 31. In some embodiments of the present disclosure, within the attenuator 30, the first diode 33 and the second diode 35 can be stripline PIN diodes, capacitors C1 and C2 are DC-blocking capacitors, capacitors C3 and C4 are bypass capacitors, and resistors Zo are resistor loads to match the diode response for the attenuation range and setting level.

In some embodiments of the present disclosure, the hybrid coupler 31 can be implemented by a chip LDC311G9603B-767 supplied by Murata Manufacturing co., ltd., and the first diode 33 and the second diode 35 can be implemented by HSMP-3814 supplied by Avago Technologies. In some embodiments of the present disclosure, the attenuator 30 as a whole can be implemented by a chip GSV401 supplied by SOSHIN ELECTRIC CO., LTD.

As the voltage (peak power level) of the applied peak power attenuation signal (Vpeak-attn) from the peak power detecting module 40 increases, the current flows through the first diode 33 and the second diode 35 increases correspondingly, wherein the overall impedance approaches 50Ω, and the amplitude of the output attenuated signal (RFattn)=is decreased to high attenuation. As a result, as the power level of the input signal increases over the pre-set peak power threshold (Povpeak), the peak power detecting module 40 applies the peak power attenuation signal (Vpeak-attn) to the attenuator 30, which correspondingly decreases the power level of the output attenuated signal (RFattn) when converting the first signal into the attenuated signal (RFattn) and to the gain block amplifier (driver amplifier) 21. Similarly, as the power level of the output signal increases over a pre-set average power threshold (Povavg), the average power detecting module 50 is enabled to generate the average power attenuation signal (Vavg-attn) to the attenuator 30, which correspondingly decreases the power level of the attenuated signal (RFattn) when converting the first signal into the attenuated signal (RFattn) and to the gain block amplifier (driver amplifier) 21.

Figure 3:
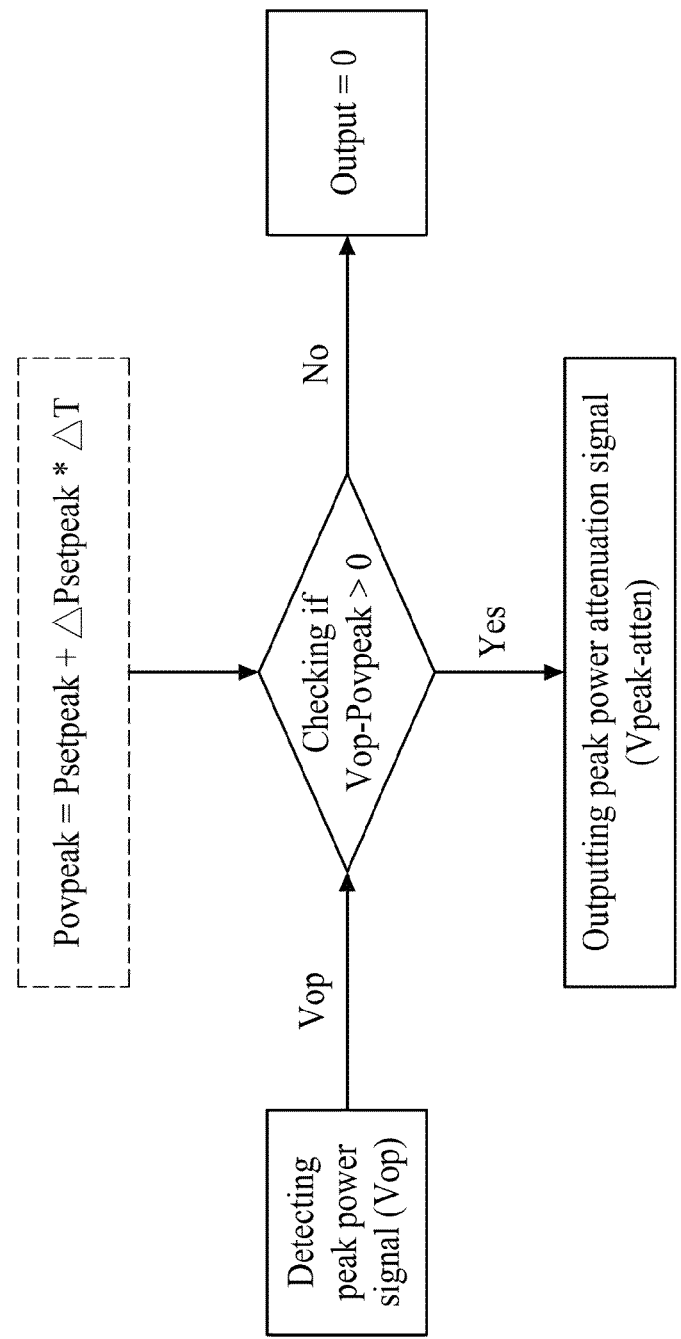
FIG. 3 is a flow chart showing the operation of the peak power detecting module in accordance with embodiments of the inventive arrangements disclosed herein.

FIG. 3 is a flow chart showing the operation of the peak power detecting module 40 in accordance with embodiments of the inventive arrangements disclosed herein. In some embodiments of the present disclosure, the peak power threshold (Povpeak) for the peak power detecting module 40 is generated by a digital-to-analog converter (DAC) and a micro-controller's firmware setting in the amplifier module 20.

As shown in FIG. 3, a parameter (Psetpeak) is pre-set and stored in an EEPROM memory for a certain setting temperature. The DAC and the micro-controller in the amplifier module 20 calculate the peak power threshold (Povpeak) from the parameter (Psetpeak) and a temperature compensative factor ($\Delta$Psetpeak*$\Delta$T), wherein $\Delta$T represents the difference between the real operating temperature and the setting temperature.

$$Povpeak = Psetpeak + \Delta Psetpeak * \Delta T$$

When the operating temperature is equal to the setting temperature, Povpeak=Psetpeak.

The fast comparator 43 of the peak power detecting module 40 compares the threshold voltage (Povpeak) with the detected peak power signal (Vop) from the peak power detector 41. If the Vop−Povpeak>0, i.e., the input peak power level is higher than the setting threshold level, then the fast comparator 43 generates a positive pulse signal (Vpeak-attn), such as a 5V pulse signal, to the attenuator 30 and thereby decreases the power level of the signal from the attenuator 30 to the input terminal of the amplifier module 20. If the Vop−Povpeak<0, i.e., no over-peak power event occurs, then the output voltage of the fast comparator 43 is zero and the attenuator 30 does nothing.

Figure 4:
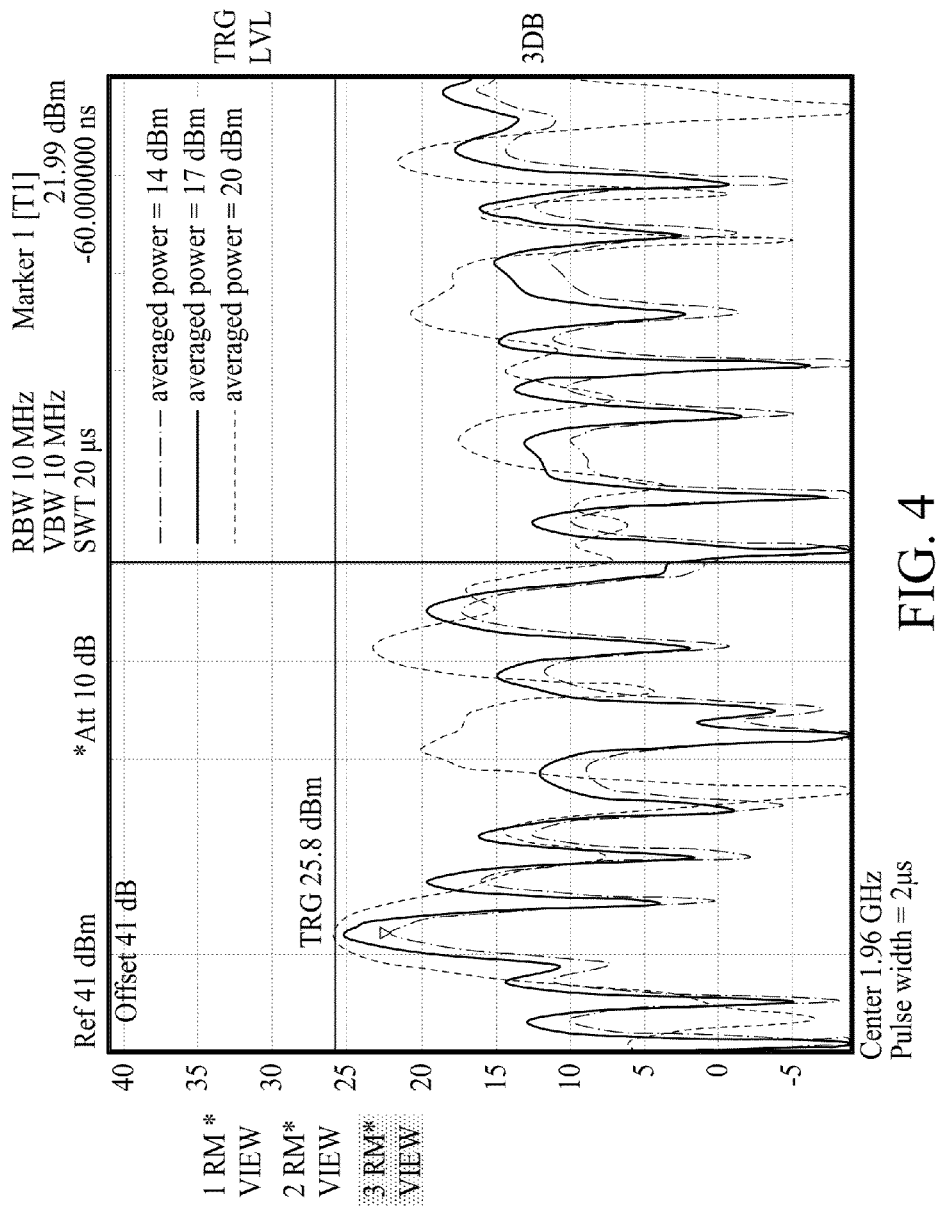
FIG. 4 shows a peak power compression test by using single carrier UMTS (Universal Mobile Telecommunications System) signals.

FIG. 4 shows a peak power compression test by using single carrier UMTS (Universal Mobile Telecommunications System) signals, wherein a linear test signal of PAR=8.2 dB is applied to the input terminal of the amplifying system 10. The peak power threshold limit (Vovpeak) of the amplifying system 10 is set on 25 dBm. A first waveform with an injected averaged power of 14 dBm shows a peak power of 22.2 dBm, and the output power of the amplifying system 10 does not exceed the peak power threshold limit (Vovpeak).

A second waveform with an injected averaged power of 17 dBm shows a peak power of 25.2 dBm, and the output peak power of the amplifying system 10 exceeds the peak power threshold limit (Vovpeak). The peak power protection mechanism, implemented by the attenuator 30 and the peak power detecting module 40, is enabled to clamp the output peak power of the amplifying system 10 on 25 dBm, and the peak power protection mechanism starts to distort the amplitude of the linear waveform as compared with the first waveform.

A third waveform with an injected averaged power of 20 dBm shows a peak power of 28.2 dBm, and the output peak power of the amplifying system 10 exceeds the peak power threshold limit (Vovpeak). The peak power protection mechanism, implemented by the attenuator 30 and the peak power detecting module 40, is fully enabled to clamp the output peak power of the amplifying system 10 on 25 dBm. The clamped power has an overshoot response to 25.8 dBm, making it very non-linear as serious AM and PM distortion on the linear waveform as compared with the first waveform.

Figure 5:
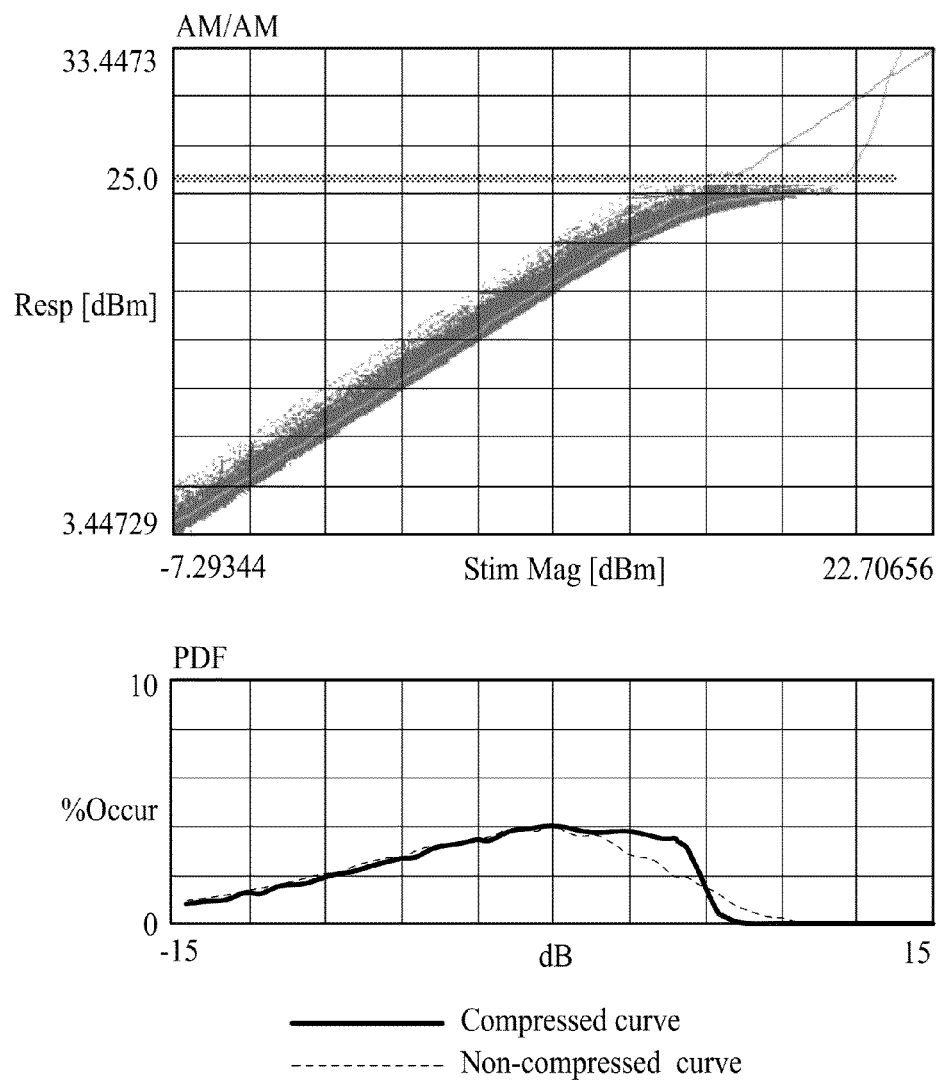
FIGS. 5 and 6 show a peak power compression test by using single carrier CDMA signals.
Figure 6:
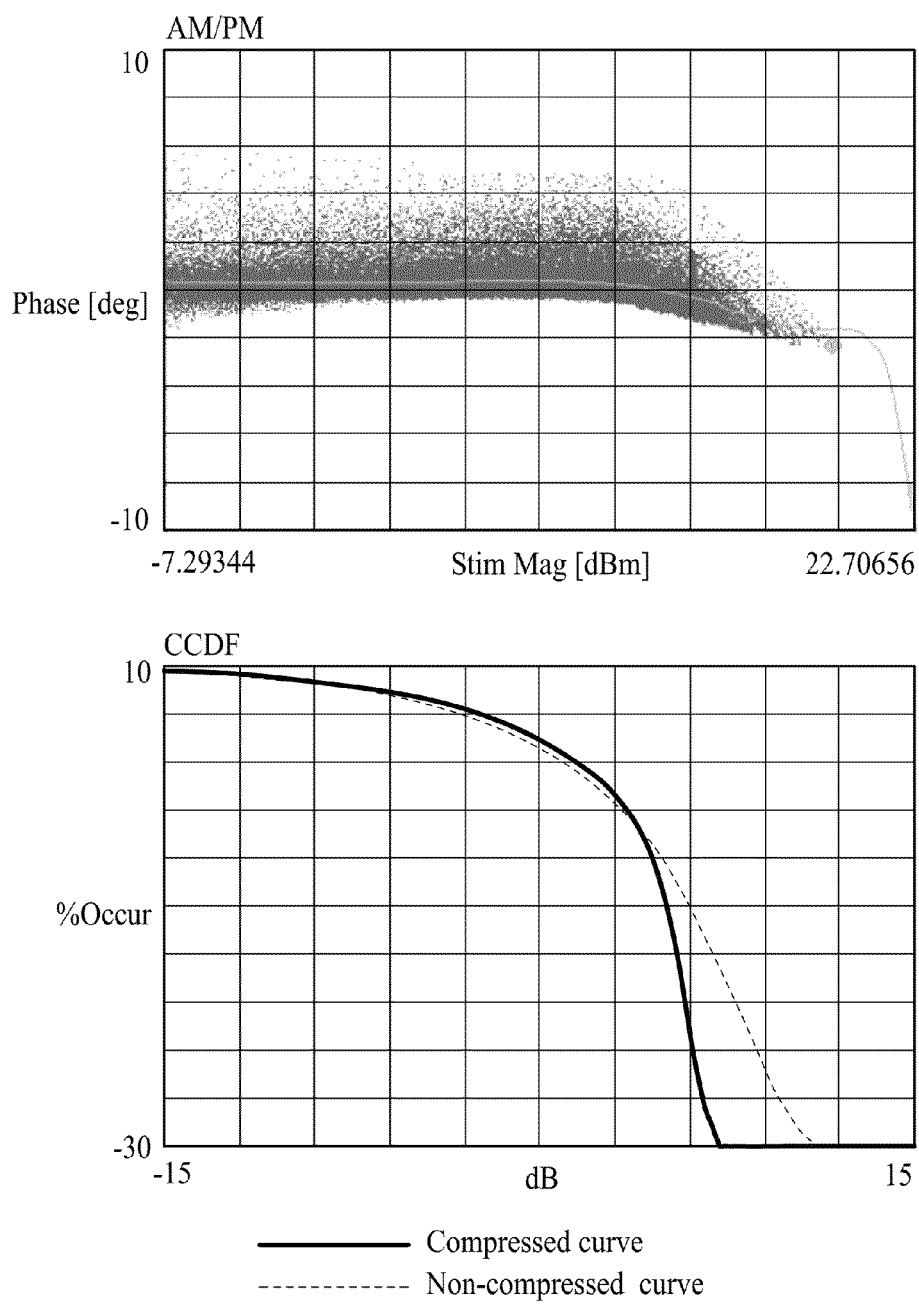

FIGS. 5 and 6 show a peak power compression test by using single carrier CDMA signals, wherein a linear test signal of PAR=11.3 dB is applied to the input terminal of the amplifying system 10. The peak power threshold (Povpeak) of the amplifying system 10 is set on 25 dBm. The input signal is linear, non-distorted, and has an injected averaged power of 7.7 dBm and a peak power of 19 dBm. In FIGS. 5 and 6, there are 30 million test points with different input powers, and when the input power is higher than 25 dBm, the attenuator 30 is enabled to clamp the peak power on 25 dBm in order to meet the output power limit. With the power distribution function (PDF) curves in FIG. 5, the high power portion (higher than 25 dBm) of the output power, represented by the compressed curve, is greatly compressed by about 6 dB, as compared to the input power represented by the non-compressed curve. Similarly, in the power complementary cumulative distribution function (CCDF) curves, the PARs have been compressed to about 6.3 dB by the attenuator 30, as shown in FIG. 6.

Figure 7:
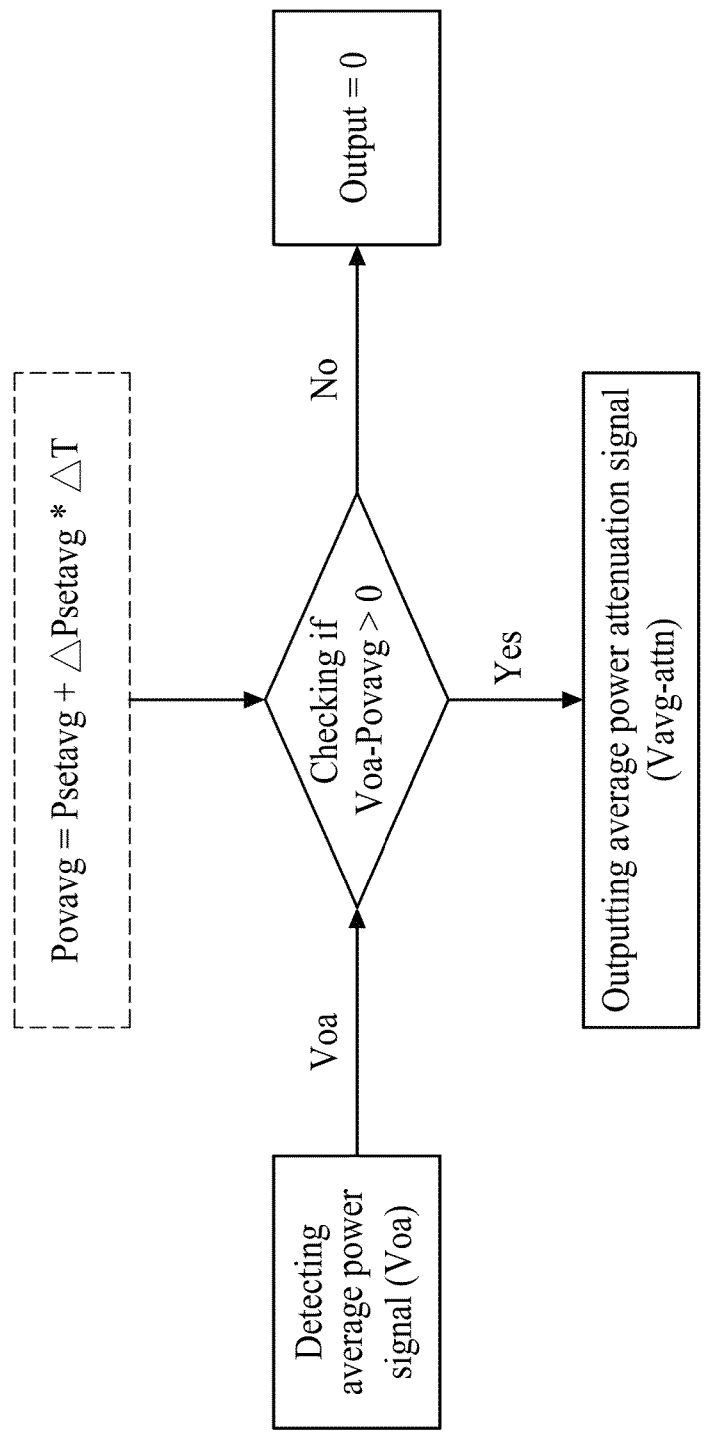
FIG. 7 is a flow chart showing the operation of the average power detecting module in FIG. 1 in accordance with embodiments of the inventive arrangements disclosed herein.

FIG. 7 is a flow chart showing the operation of the average power detecting module 50 in FIG. 1 in accordance with embodiments of the inventive arrangements disclosed herein. As shown in FIG. 7, a parameter (Psetavg) is pre-set and stored in an EEPROM memory for a certain setting temperature. The DAC and the micro-controller in the amplifying system 10 calculate the pre-set average power threshold (Povavg) from the parameter (Psetavg) and a temperature compensative factor (ΔPsetavg*ΔT), wherein ΔT represents the difference between the real operating temperature and the setting temperature.

Povavg=Psetavg+ΔPsetavg*ΔT

When the operating temperature is equal to the setting temperature, Povavg=Psetavg.

The comparator 53 of the average power detecting module 50 compares the pre-set average power threshold (Povavg) with the detected average power signal (Voa) from the average power detector 51. If the Voa−Povavg>0, i.e., the output average power level is higher than the setting threshold level, then the comparator 53 generates a positive signal (Vavg-attn) to the attenuator 30 and thereby decreases the power level of the signal from the attenuator 30 and to the input terminal of the amplifier module 20. If the Voa−Povavg<0, i.e., no over average power event occurs, then the output voltage of the comparator 53 is zero and the attenuator 30 does nothing.

Figure 8:
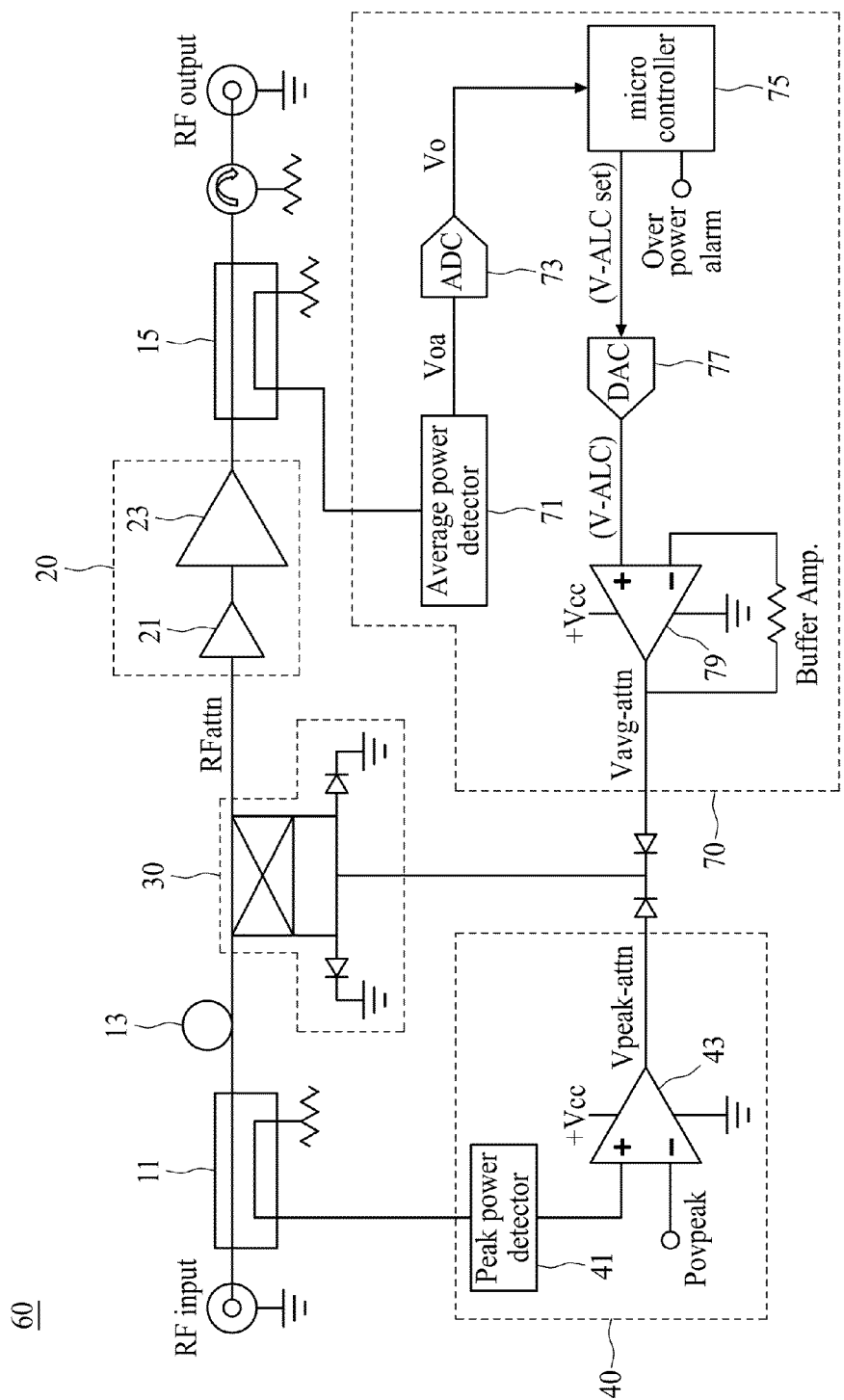
FIG. 8 is a schematic diagram showing a radio frequency signal amplifying system in accordance with embodiments of the inventive arrangements disclosed herein.
Figure 9:
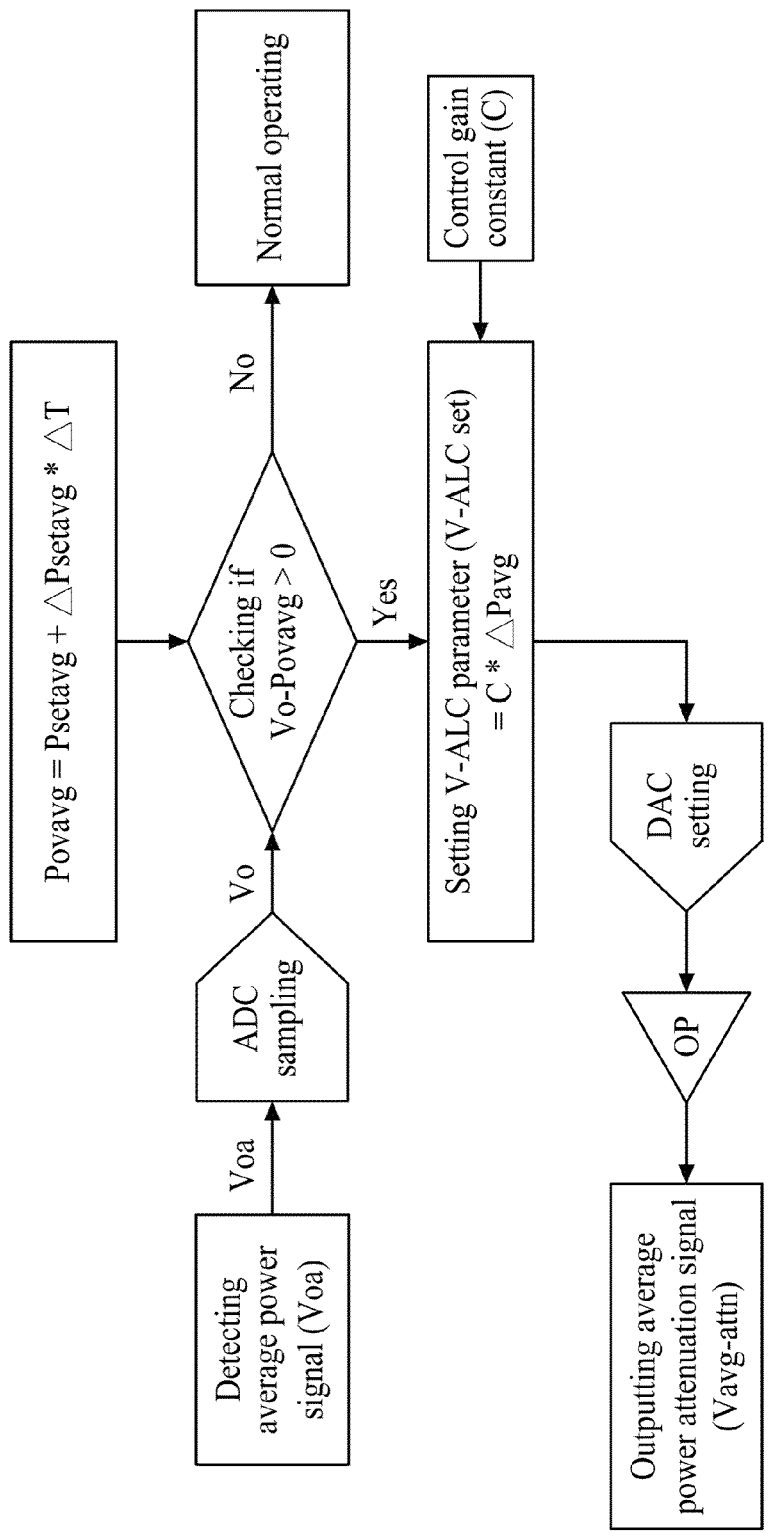
FIG. 9 is a flow chart showing the operation of the average power detecting module in FIG. 8 in accordance with embodiments of the inventive arrangements disclosed herein.

FIG. 8 is a schematic diagram showing a radio frequency signal amplifying system 60 in accordance with embodiments of the inventive arrangements disclosed herein, and FIG. 9 is a flow chart showing the operation of the average power detecting module 70 in FIG. 8 in accordance with embodiments of the inventive arrangements disclosed herein. The signal amplifying system 10 in FIG. 1 uses an analog feedback design on the average power detecting module 50; in contrast, the signal amplifying system 60 in FIG. 8 uses a digital feedback design to implement an average power detecting module 70.

In some embodiments of the present disclosure, the average power detecting module 70 comprises an average power detector 71 connected to the output terminal of the amplifier module 20, an analog-to-digital converter (ADC) 73 connected to the average power detector 71, a micro-controller 75 connected to the analog-to-digital converter 73, a digital-to-analog converter (DAC) 77 connected to the micro-controller 75, and a comparator 79, such as a buffer amplifier, having an input node connected to the digital-to-analog converter 77 and an output node connected to the attenuator 30.

In some embodiments of the present disclosure, the average power detector 71 is configured to detect an average (RMS) power of the fourth signal from the output signal, and the detected average power signal (Voa) from the average power detector 71 is fed to the analog-to-digital converter 73 in order to transfer the detected analog power signal into a digital power signal (Vo) by the sampling technique. The digital power signal (Vo) is then sent to the micro-controller 75, which is configured to check if the digital power signal (Vo) is higher than the pre-set average power threshold (Povavg). When the digital power signal (Vo) is higher than the pre-set average power threshold (Povavg), i.e., Vo−Povavg>0, the micro-controller 75 sets digital control parameters (V-ALC set); in addition, the micro-controller 75 can generate an over power alarm for a predetermined period when Vo−Povavg>0.

The difference (ΔPavg) between the digital power signal (Vo) and the pre-set threshold voltage (Povavg), i.e., ΔPavg=Vo−Povavg, is used to generate digital control parameters (V-ALC set) by taking a control gain constant (C) into consideration, so as to accelerate or create over/under shoot controls for the attenuator 30 to the stable attenuation. The digital control parameters (V-ALC set) are then inputted to the digital-to-analog converter 77 and the comparator 79 for generating average power attenuation signals (Vavg-attn).

Figure 10:
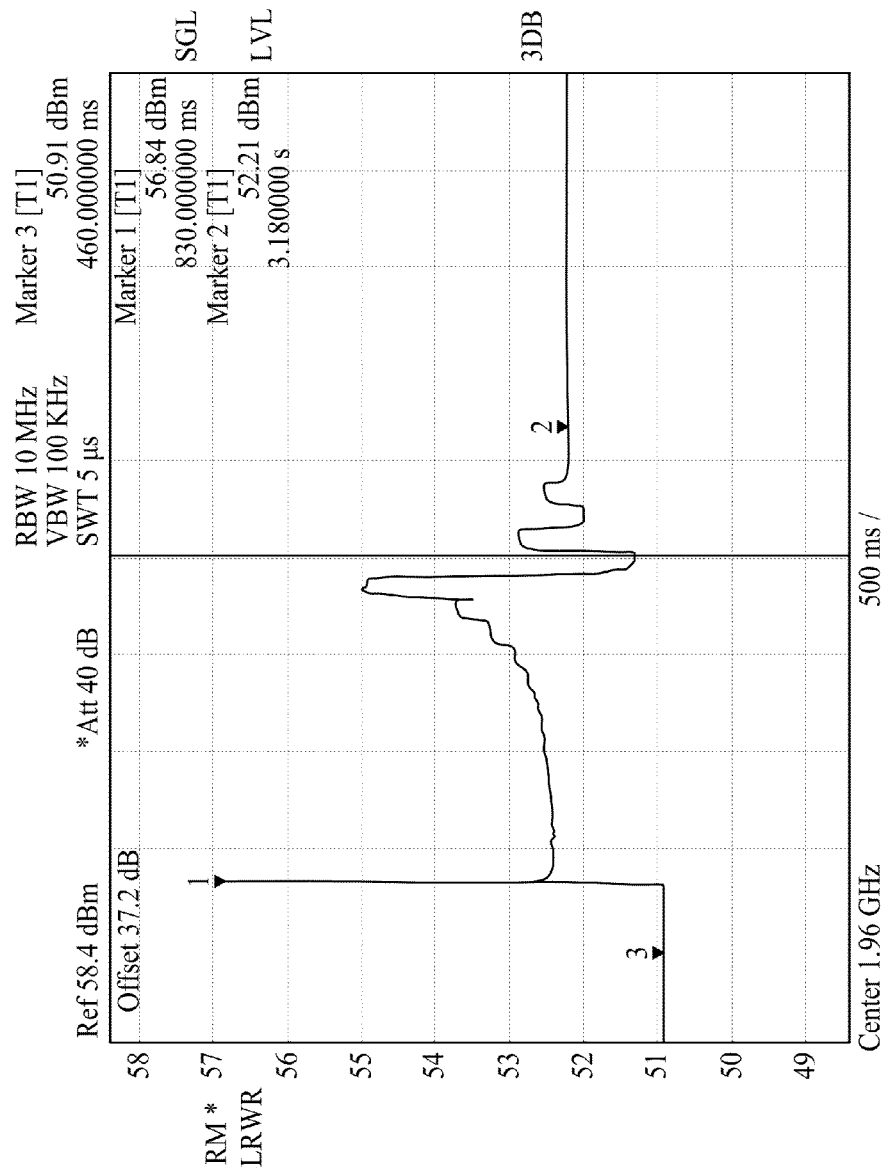
FIG. 10 shows an averaged power protection test by inputting a continuous wave (CW) signal with +10 dB power to the amplifying system in FIG. 8.

FIG. 10 shows an averaged power protection test by inputting a continuous wave (CW) signal with +10 dB power to the amplifying system 60 in FIG. 8, wherein the amplifying system 10 originally operates at a stable output power condition of a nominal 50.8 dBm. The test is conducted by adding the +10 dB CW signal on the input terminal and measuring the output power spectrum on the output terminal of the amplifying system 10. As shown in FIG. 10, the averaged power is rated stably at 52.3 dBm and substantially by a 2.2 second response as the +10 dB test signal is inputted to the input terminal.

Figure 11:
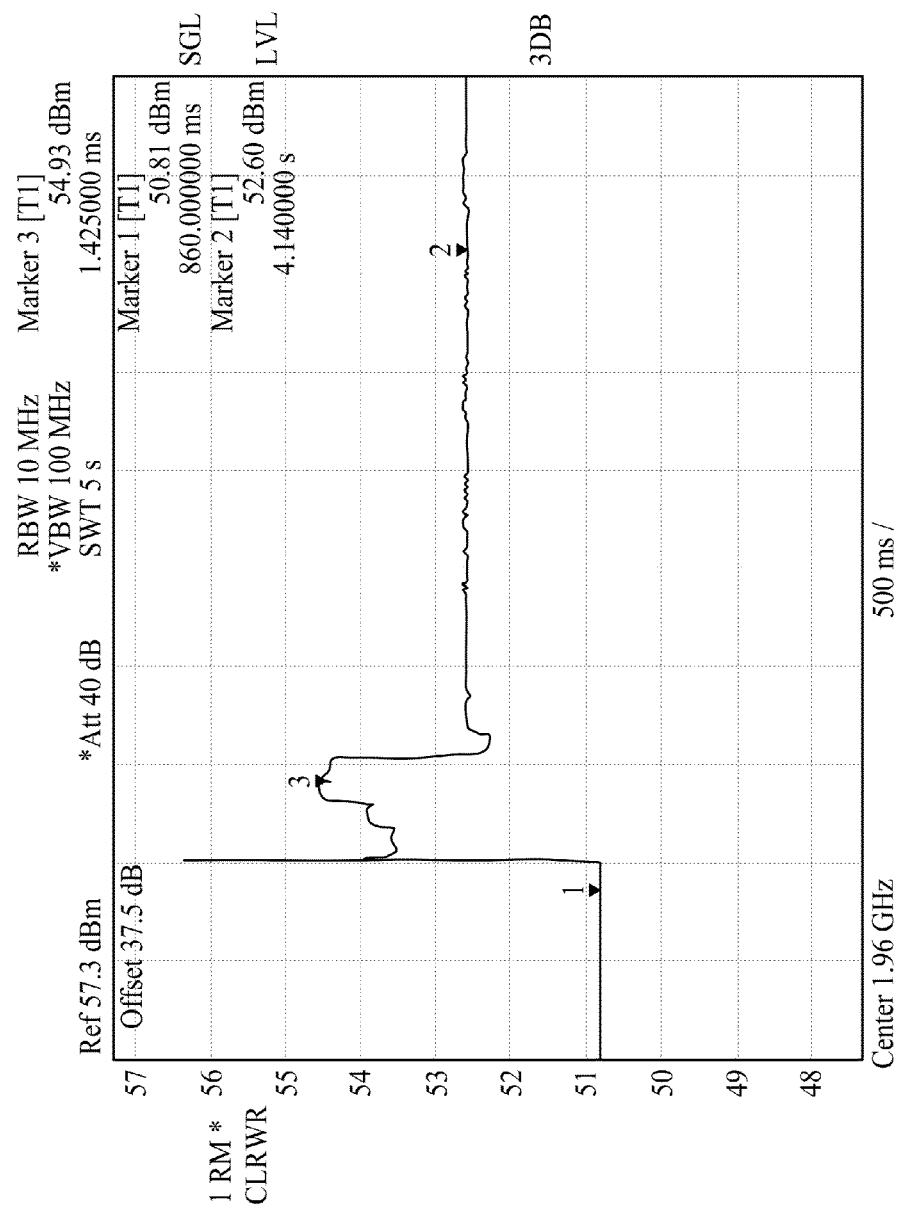
FIG. 11 shows an averaged power protection test by inputting an UMTS signal with +10 dB power to the amplifying system in FIG. 8.

FIG. 11 shows an averaged power protection test by inputting a UMTS signal with +10 dB power to the amplifying system 60 in FIG. 8, wherein the amplifying system 10 originally operates at a stable output power condition of a nominal 50.8 dBm. The test is conducted by adding the +10 dB UMTS signal on the input terminal and measuring the output power spectrum on the output terminal of the amplifying system 10. As shown in FIG. 11, the averaged power is rated stably on 52.6 dBm and substantially by a 600 ms response as the +10 dB test signal is inputted to the input terminal.

Figure 12:
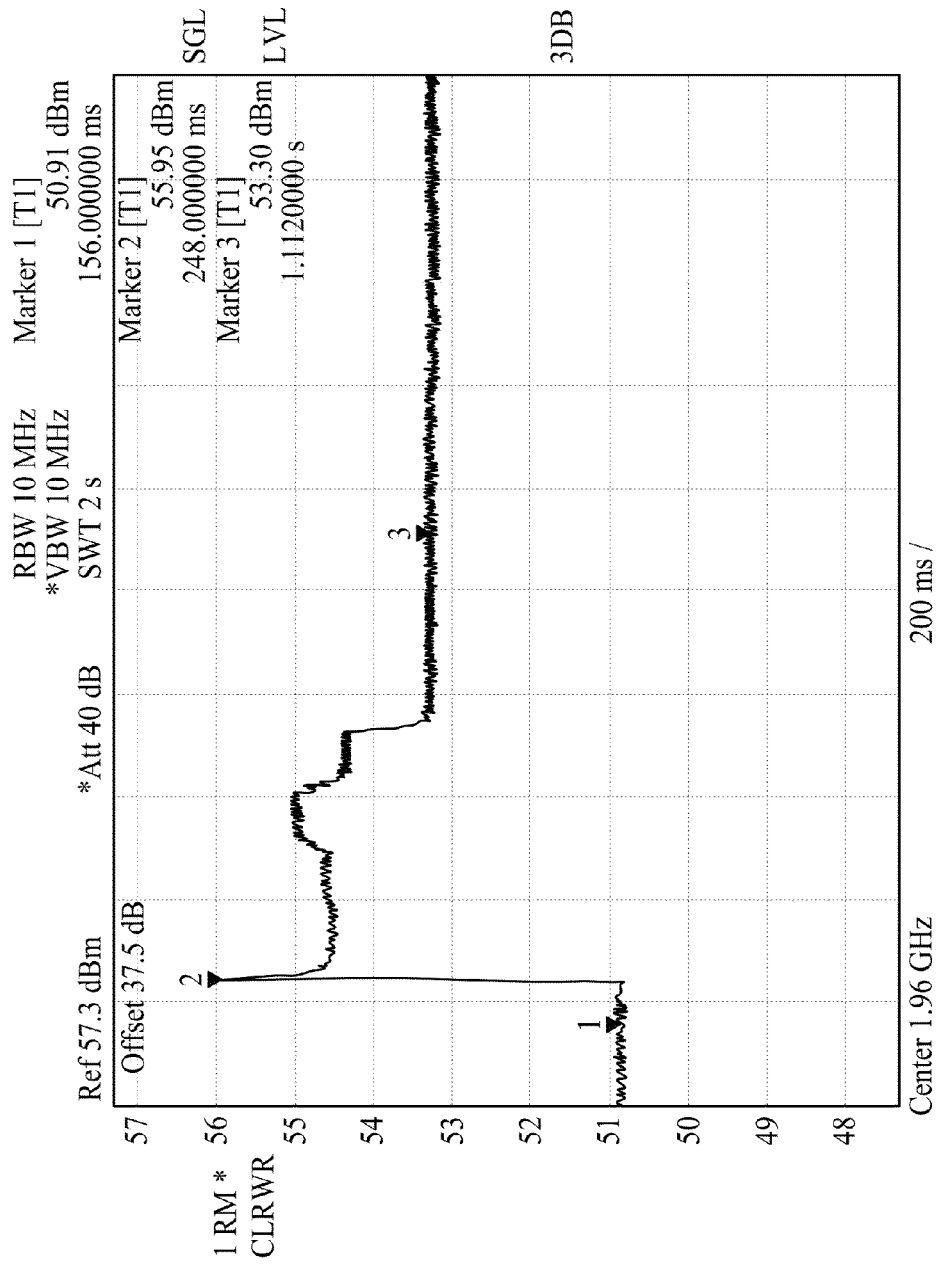
FIG. 12 shows an averaged power protection test by inputting a CDMA signal with +10 dB power to the amplifying system in FIG. 8.

FIG. 12 shows an averaged power protection test by inputting a CDMA signal with +10 dB power to the amplifying system 60 in FIG. 8, wherein the amplifying system 10 originally operates at a stable output power condition of a nominal 50.8 dBm. The test is conducted by adding the +10 dB CDMA signal on the input terminal and measuring the output power spectrum on the output terminal of the amplifying system 10. As shown in FIG. 12, the averaged power is rated stably on 53.3 dBm and substantially by a 500 ms response as the +10 dB test signal is inputted to the input terminal.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A radio frequency signal amplification system, comprising:
   an amplifier having an input terminal and an output terminal;
   an input coupler configured to divide an input signal into a first signal and a second signal;
   an attenuator electrically connected to the input terminal of the amplifier;
   a delay line connected between the input coupler and the attenuator; and
   a peak power detecting module configured to apply a peak power attenuation signal to the attenuator by taking a peak power level of the second signal into consideration,
   wherein the attenuator is configured to generate an attenuated signal to the input terminal of the amplifier by taking the peak power attenuation signal into consideration,
   wherein the attenuator comprises a hybrid coupler configured to decrease an amplitude of the attenuated signal as the peak power level of the peak power attenuation signal increases, and
   wherein the attenuator comprises:
   a first diode having a first positive node connected to the peak power detecting module, and a first negative node connected to a first port of the hybrid coupler; and
   a second diode having a second positive node connected to the peak power detecting module, and a second negative node connected to a second port of the hybrid coupler.

2. The radio frequency signal amplification system of claim 1, wherein the attenuator includes an input port connected to the delay line, an output port connected to the amplifier, and a power supply port configured to receive the peak power attenuation signal.

3. The radio frequency signal amplification system of claim 1, wherein the delay line has a length calculated by taking a response time of the attenuator and a response time of the peak power detecting module into consideration.

4. The radio frequency signal amplification system of claim 1, wherein the peak power detecting module comprises:
   a peak power detector connected to the input coupler; and
   a comparator with an input node connected to the peak power detector, and an output node connected to the attenuator.

5. A radio frequency signal amplification system, comprising:
   an amplifier having an input terminal and an output terminal;
   an attenuator electrically connected to the input terminal of the amplifier;
   an output coupler configured to divide an output signal from the amplifier into a first signal and a second signal; and
   an average power detecting module configured to apply an average power attenuation signal to the attenuator by taking an average power level of the second signal into consideration;
   wherein the attenuator is configured to generate an attenuated signal to the input terminal of the amplifier by taking the average power attenuation signal into consideration,
   wherein the attenuator comprises a hybrid coupler configured to decrease an amplitude of the attenuated signal as the average power level of the average power attenuation signal increases, and
   wherein the attenuator comprises:
   a first diode having a first positive node connected to the average power detecting module, and a first negative node connected to a first port of the hybrid coupler; and
   a second diode having a second positive node connected to the average power detecting module, and a second negative node connected to a second port of the hybrid coupler.

6. The radio frequency signal amplification system of claim 5, wherein the attenuator includes an input port configured to receive an input signal, an output port connected to the amplifier, and a power supply port configured to receive the average power attenuation signal.

7. The radio frequency signal amplification system of claim 5, wherein the average power detecting module comprises:
   an average power detector configured to detect an average power of the second signal; and
   a comparator having an input node connected to the average power detector and an output node connected to the attenuator.

8. The radio frequency signal amplification system of claim 5, wherein the average power detecting module comprises:
   an average power detector configured to detect average power of the second signal;
   an analog-to-digital converter connected to the average power detector;
   a micro-controller connected to the analog-to-digital converter;
   a digital-to-analog converter connected to the micro-controller; and
   a comparator having an input node connected to the digital-to-analog converter and an output node connected to the attenuator.

9. A radio frequency signal amplification system, comprising:
   an amplifier having an input terminal and an output terminal;
   an attenuator electrically connected to the input terminal of the amplifier;
   a peak power detecting module configured to apply a peak power attenuation signal to the attenuator by taking a peak power level of an input signal into consideration; and
   an average power detecting module configured to apply an average power attenuation signal to the attenuator by taking an average power level of an output signal from the output terminal into consideration;

wherein the attenuator is configured to generate an attenuated signal to the input terminal of the amplifier by taking the peak power attenuation signal, the average power attenuation signal, or the combination thereof into consideration.

10. The radio frequency signal amplification system of claim 9, further comprising:
   an input coupler configured to divide the input signal into a first signal and a second signal; and
   wherein the peak power detecting module is configured to apply the peak power attenuation signal to the attenuator by taking the peak power level of the second signal into consideration.

11. The radio frequency signal amplification system of claim 10, further comprising a delay line connected between the input coupler and the attenuator.

12. The radio frequency signal amplification system of claim 11, wherein the delay line has a length calculated by taking a response time of the attenuator and a response time of the peak power detecting module into consideration.

13. The radio frequency signal amplification system of claim 9, further comprising an output coupler configured to divide the output signal into a third signal and a fourth signal, wherein the average power detecting module is configured to apply the average power attenuation signal to the attenuator by taking the average power level of the fourth signal into consideration.

14. The radio frequency signal amplification system of claim 9, wherein the attenuator comprises a hybrid coupler configured to decrease an amplitude of the attenuated signal as the peak power level of the peak power attenuation signal increases.

15. The radio frequency signal amplification system of claim 14, wherein the attenuator comprises:
   a first diode having a first positive node connected to the peak power detecting module, and a first negative node connected to a first port of the hybrid coupler; and
   a second diode having a second positive node connected to the peak power detecting module, and a second negative node connected to a second port of the hybrid coupler.

16. The radio frequency signal amplification system of claim 9, wherein the attenuator comprises a hybrid coupler configured to decrease an amplitude of the attenuated signal as the average power level of the average power attenuation signal increases.

17. The radio frequency signal amplification system of claim 16, wherein the attenuator comprises:
   a first diode having a first positive node connected to the average power detecting module, and a first negative node connected to a first port of the hybrid coupler; and
   a second diode having a second positive node connected to the average power detecting module, and a second negative node connected to a second port of the hybrid coupler.

18. The radio frequency signal amplification system of claim 9, wherein the peak power detecting module comprises:
   a peak power detector connected to the input coupler; and
   a comparator with an input node connected to the peak power detector and an output node connected to the attenuator.

19. The radio frequency signal amplification system of claim 9, wherein the average power detecting module comprises:
   an average power detector configured to detect an average power of the second signal; and
   a comparator having an input node connected to the average power detector and an output node connected to the attenuator.

20. The radio frequency signal amplification system of claim 9, wherein the average power detecting module comprises:
   an average power detector configured to detect an average power of the second signal;
   an analog-to-digital converter connected to the average power detector;
   a micro-controller connected to the analog-to-digital converter;
   a digital-to-analog converter connected to the micro-controller; and
   a comparator having an input node connected to the digital-to-analog converter, and an output node connected to the attenuator.

* * * * *